United States Patent
Mun (10) Patent No.: US 11,700,464 B2
(45) Date of Patent: Jul. 11, 2023

(54) SELECTIVE NITRIDED GATE-OXIDE FOR RTS NOISE AND WHITE-PIXEL REDUCTION

(71) Applicant: OmniVision Technologies, Inc., Santa Clara, CA (US)

(72) Inventor: Seong Yeol Mun, Santa Clara, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 584 days.

(21) Appl. No.: 16/738,981

(22) Filed: Jan. 9, 2020

(65) Prior Publication Data

US 2021/0218914 A1 Jul. 15, 2021

(51) Int. Cl.
| | |
|---|---|
| *H01L 29/51* | (2006.01) |
| *H04N 25/63* | (2023.01) |
| *H01L 27/146* | (2006.01) |
| *H04N 25/75* | (2023.01) |

(52) U.S. Cl.
CPC ....... *H04N 25/63* (2023.01); *H01L 27/14603* (2013.01); *H01L 27/14614* (2013.01); *H01L 27/14689* (2013.01); *H01L 29/513* (2013.01); *H04N 25/75* (2023.01)

(58) Field of Classification Search
CPC .. H04N 5/361; H04N 5/378; H01L 27/14689; H01L 27/14641; H01L 27/14603; H01L 27/14614; H01L 27/14616; H01L 27/14643; H01L 29/513
USPC ......................................................... 257/292
See application file for complete search history.

(56) References Cited

U.S. PATENT DOCUMENTS

| | | | |
|---|---|---|---|
| 5,596,218 A | 1/1997 | Soleimani et al. | |
| 6,642,543 B1* | 11/2003 | El Gamal | H01L 27/0922 257/296 |
| 6,835,590 B2* | 12/2004 | Lee | H01L 27/14689 257/E21.243 |
| 10,043,841 B1 | 8/2018 | Chang et al. | |
| 2003/0086011 A1* | 5/2003 | Wu | H01L 27/14603 348/308 |

\* cited by examiner

*Primary Examiner* — Hrayr A Sayadian
(74) *Attorney, Agent, or Firm* — Christensen O'Connor Johnson Kindness PLLC (57) ABSTRACT

A pixel cell includes a nitrogen-implanted region at a semiconductor material-gate oxide proximate interface located in a region above a photodiode. The pixel cell is further devoid of implanted nitrogen in channel regions of a plurality of pixel transistors. Thus, Si—N bonds are formed at the semiconductor material-gate oxide interface in the region above the photodiode, while the channel regions are protected from nitrogen implantation at the semiconductor material-gate oxide interface. Methods of forming the pixel cell are also described.

21 Claims, 6 Drawing Sheets

SELECTIVE NITRIDED GATE-OXIDE FOR RTS NOISE AND WHITE-PIXEL REDUCTION

BACKGROUND INFORMATION

Field of the Disclosure

This disclosure relates generally to image sensors, and in particular but not exclusively, relates to pixel cells having a selectively nitride gate oxide region.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The technology used to manufacture image sensors has continued to advance at a great pace. The demands of higher resolution and lower power consumption have encouraged the further miniaturization and integration of these devices. Combined with the demands for image sensors with high dynamic range and low light sensitivity have made the designs of pixel cells with high conversion gain and a high signal to noise ratio increasingly challenging.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses and methods directed to pixel cells with a nitrogen-implanted region at a semiconductor material-gate oxide interface located in a region above a photodiode are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

During a pixel manufacturing process, it is believed that silicon (Si) dangling bonds and/or weak bonds, such as silicon-hydrogen (Si—H) bonds, are present in a photodiode. These chemical structural defects can act as a generation-recombination (G-R) centers and increase current leakage to the photodiode, thereby causing dark current resulting in white pixel (WP) defects. Decoupled-plasma-nitridation (DPN) treatment is carried out on the semiconductor surface, forming silicon-nitrogen (Si—N) bonds, which can decrease WP defects by reducing the number of G-R centers. After DPN treatment, a final $SiO_2$ growing step is carried out directly on the Si surface of the pixel to provide a gate oxide layer. However, the nitrogen added by DPN to the Si interface also degrades RTS noise in transistors, because the nitrogen present in the gate oxide layer and poly-silicon gate interface traps and de-traps the carrier electrons ($e^-$).

As will be discussed, examples in accordance with the teachings of the present invention are directed to a pixel cell that includes a nitrogen-implanted region at a semiconductor material-gate oxide proximate interface located in a region above a photodiode. The pixel cell is further devoid of implanted nitrogen at the semiconductor material-gate oxide proximate interface located in channel regions of a plurality of pixel transistors. Thus, Si—N bonds are formed at the semiconductor material-gate oxide interface in the region above the photodiode, while the channel regions are protected from or shielded from nitrogen implantation at the semiconductor material-gate oxide interface. By reacting the Si dangling bonds to form Si—N bonds, and replacing weaker bonds (e.g., Si—H bonds) with Si—N bonds at the semiconductor material-gate oxide proximate interface in the region above the photodiode, the number of G-R centers can be reduced, which in turn reduces current leakage and the number of WP defects. Furthermore, because the pixel cell is devoid of implanted nitrogen at the semiconductor material-gate oxide proximate interface located in the channel regions of a plurality of pixel transistors, carrier trap and de-trap-induced random telegraph signal (RTS) noise is reduced and/or prevented.

Figure 1A:
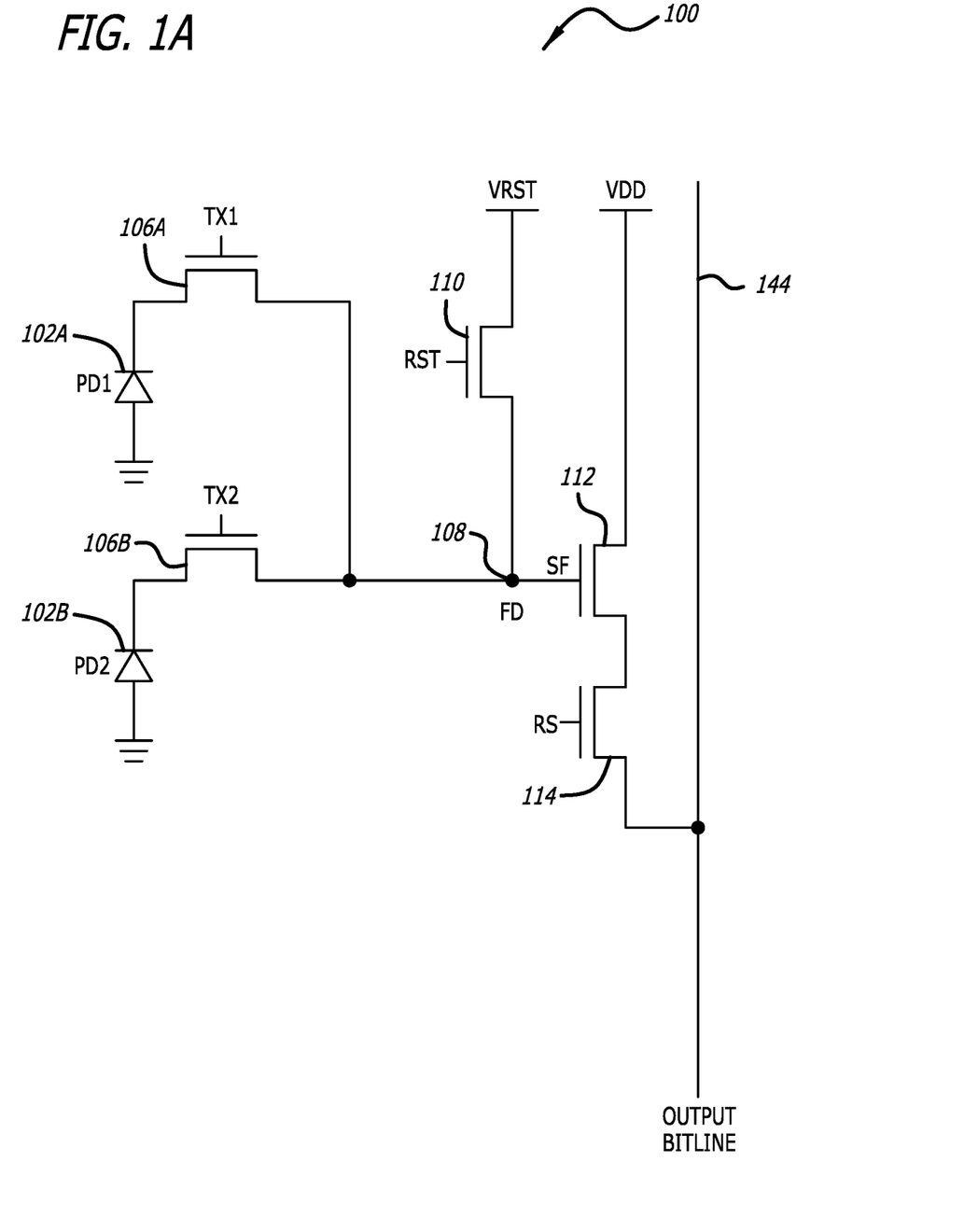
FIG. 1A is a schematic illustrating one example of a pixel cell with two photodiodes in accordance with the teachings of the present disclosure.
Figure 1B:
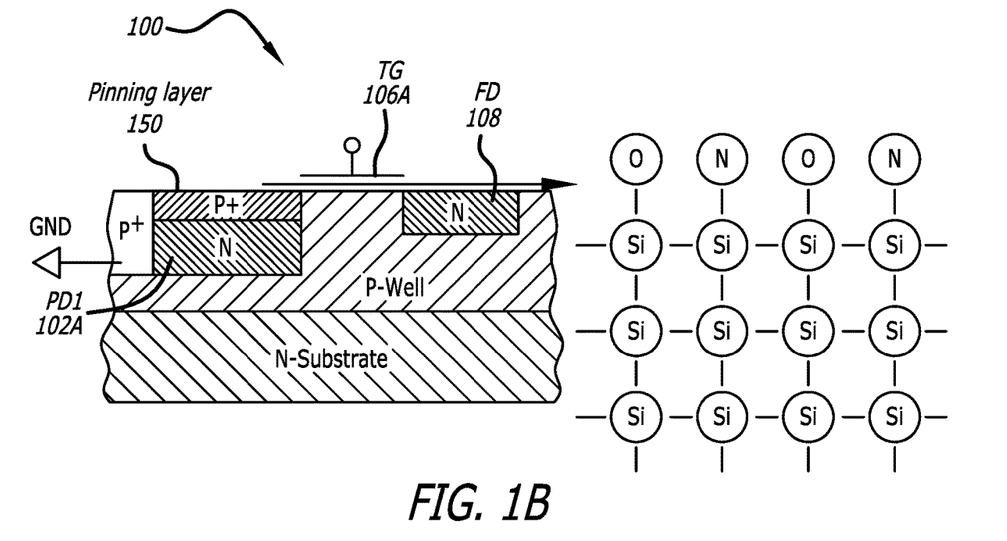
FIG. 1B is a cross-section view illustrating one example of a portion of a pixel cell in accordance with the teachings of the present disclosure.

FIG. 1A is a schematic illustrating one example of a pixel cell in accordance with the teachings of the present disclosure. As shown in the example depicted in FIG. 1A, pixel cell 100 can include a plurality of photodiodes (as shown, 2 photodiodes), including photodiode PD1 102A and photodiode PD2 102B. In other examples, it is appreciated that pixel cell 100 may include a fewer number of photodiodes (e.g., one photodiode in one example) or a greater number of photodiodes (e.g., four photodiodes in another example). In the example illustrated in FIG. 1A, the photodiodes PD1 102A and PD2 102B are configured to photogenerate image charge in response to incident light. FIG. 1B is a cross-section view illustrating one example of a portion of a pixel cell in accordance with the teachings of the present disclosure. As shown in FIG. 1B, pixel cell 100 has a semiconductor layer that has a photodiode disposed therein, and a gate oxide layer over the semiconductor layer formed on a semiconductor substrate. A nitrogen-implanted semiconductor material-gate oxide proximate interface is located in a region above a photodiode, for example photodiode PD1 102A. Thus, Si—N bonds are formed at the semiconductor material-gate oxide interface in the region above the photodiode PD1 102A, where Si dangling bonds are reacted with nitrogen to form Si—N bonds, and weaker bonds (e.g., Si—H bonds) are replaced with Si—N bonds at the semiconductor material-gate oxide proximate interface in the region above the photodiode 102A. In some embodiments, the nitrogen is implanted through gate oxide layer and distributed at a very shallow silicon (Si) surface above the photodiode 102A.

Referring back to FIG. 1A, a plurality of transfer transistors including transfer transistor 106A and transfer transistor 106B are each coupled between a floating diffusion FD 108 and respective photodiodes PD1 102A and PD2 102B. In the example, the floating diffusion FD 108 is a single floating diffusion that is shared among the photodiodes PD1 102A and PD2 102B and the transfer transistors 106A and 106B. In operation, each one of the transfer transistors 106A and 106B is coupled to transfer the image charge photogenerated in each respective photodiode PD1 102A and PD2 102B to the shared floating diffusion FD 108 in response to a respective transfer control signal TX1 and TX2 received at the respective transfer gates of the transfer transistors 106A and 106B. In some embodiments, it is appreciated that transfer transistors 106A and 106B may be referred to as transfer gates.

A source follower transistor SF 112 has a gate terminal coupled to the shared floating diffusion FD 108. In the example, the drain terminal of the source follower transistor SF 112 is coupled to a supply voltage (e.g., VDD). As such, the source follower transistor SF 112 is coupled to generate image data at the source terminal of the source follower transistor SF 112 in response to the photogenerated image charge that is stored in the floating diffusion FD 108.

A row select transistor 114 is coupled between the source terminal of the source follower transistor SF 112 and an output bitline 144 as shown. As such, the row select transistor 114 is coupled to selectively output the image data at the source terminal of the source follower transistor SF 112 in response to a row select control signal RS.

Pixel cell 100 also includes a reset transistor 110 coupled between a supply voltage (e.g., VRST) and the floating diffusion FD 108. For example, the drain terminal of the reset transistor 110 is coupled to the supply voltage VRST, and the source terminal of the reset transistor 110 is coupled to the floating diffusion FD 108. The source terminal of the reset transistor 110 is further coupled to the floating diffusion FD 108, photodiodes PD1 102A and PD2 102B through the corresponding transfer transistors 106A and 106B. As such, the reset transistor 110 is coupled to reset the pixel cell 100 in response to a reset control signal RST. For instance, reset transistor may be configured to reset the charge in the floating diffusion FD 108 as well as in the photodiodes PD1 102A and PD2 102B. In one example, the supply voltage VRST and the supply voltage VDD may be the same and provided from a voltage supply source.

Figure 1C:
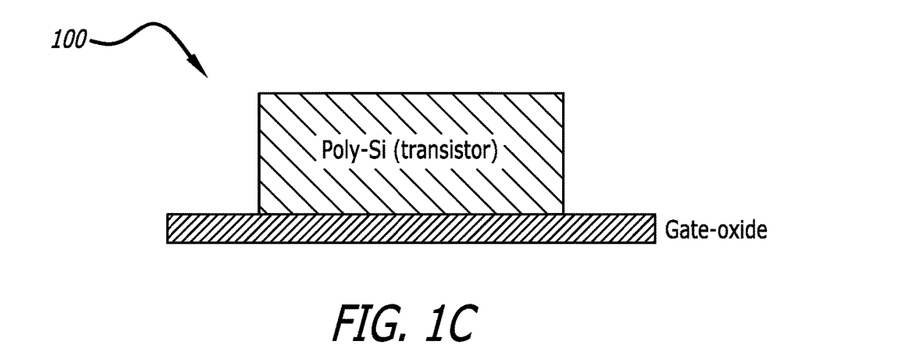
FIG. 1C is a cross-section view illustrating one example of a portion of a pixel cell in accordance with the teachings of the present disclosure.

FIG. 1C is a cross-section view illustrating one example of a portion of a pixel cell in accordance with the teachings of the present disclosure. Referring to FIG. 1C, pixel cell 100 is devoid of implanted nitrogen at the semiconductor material-gate oxide proximate interface located at channel regions of a plurality of pixel transistors.

In some embodiments, the channel regions of the pixel cell 100 can be included among a plurality of pixel transistors. For example, the plurality of pixel transistors can include a reset transistor, a source follower transistor, and a row select transistor. In some embodiments, the plurality of pixel transistors includes a transfer transistor, a reset transistor, a source follower transistor, and a row select transistor. transfer transistor, a reset transistor, a source follower transistor, and a row select transistor. In some embodiments, the plurality of pixel transistors include the transfer transistor(s), floating diffusion, reset transistor, source follower transistor, dual floating transistor, and a row select transistor.

Thus, in some embodiments, the pixel cell includes a photodiode, a floating diffusion, a plurality of doped regions of a plurality of pixel transistors of the pixel disposed in a layer of semiconductor material formed on a semiconductor substrate, a gate oxide layer disposed over the layer of semiconductor material, and a plurality of gate electrodes of the plurality of pixel transistors of the pixel disposed over the gate oxide layer. A nitrogen-implanted region is present at a semiconductor material-gate oxide proximate interface, at a region above the photodiode, and the semiconductor material-gate oxide proximate interface is devoid of implanted nitrogen in channel regions of the plurality of pixel transistors. The nitrogen-implanted region at the semiconductor material-gate oxide proximate interface at the region above the photodiode can create Si—N bonds, reduce defects at semiconductor material-gate oxide proximate interface, and prevent the semiconductor material-gate oxide proximate interface from trap and de trap charge carrier, such that both dark current noise associated with defects at the semiconductor material-gate oxide proximate interface above the photodiode and trap and de-trap-induced random telegraph signal (RTS) noise can be reduced.

Figure 2:
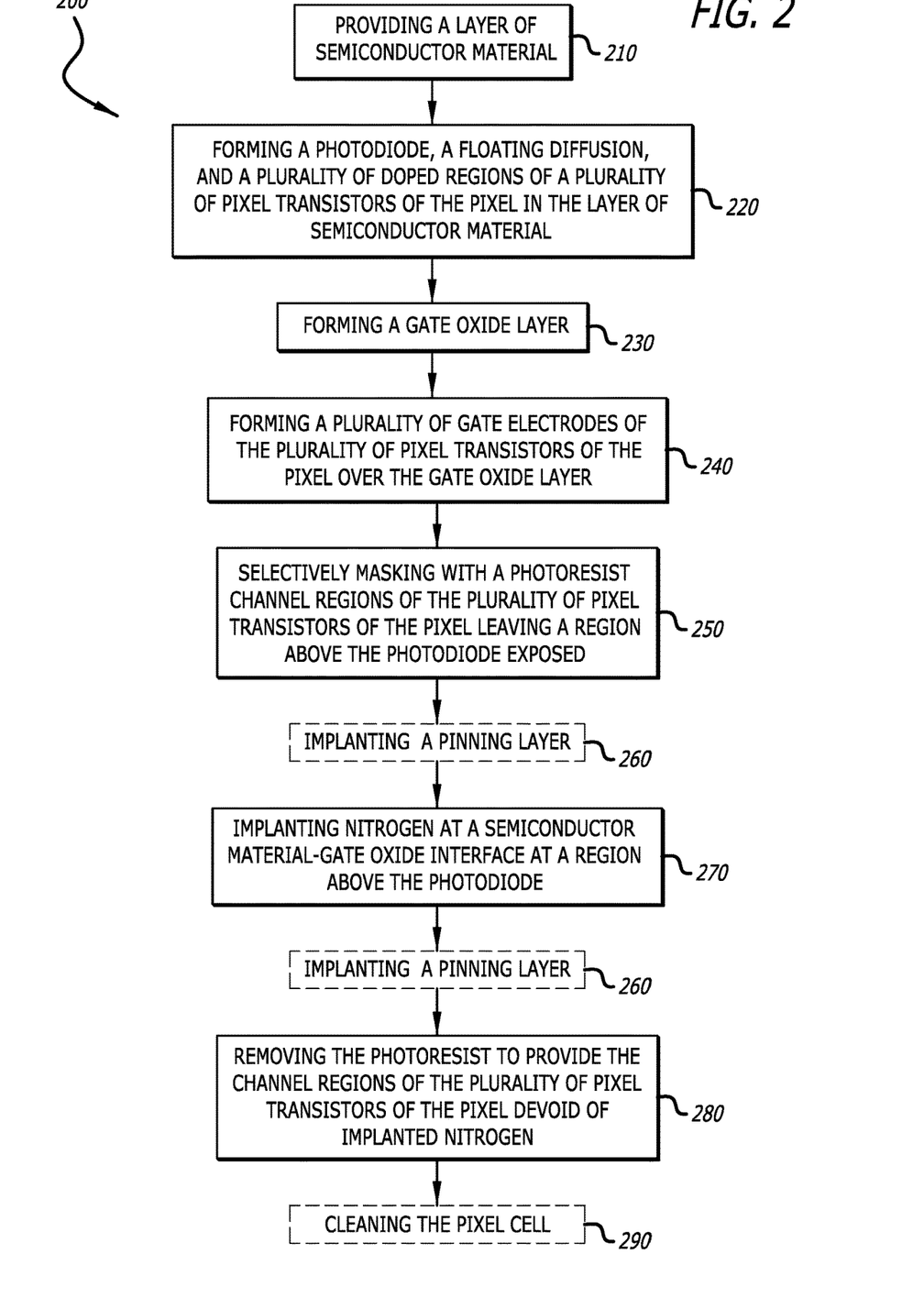
FIG. 2 is a flow chart illustrating one example of a process of making an example of a pixel cell in accordance with the teachings of the present disclosure.

FIG. 2 is a flow chart illustrating one example of a process of making an example of a pixel cell in accordance with the teachings of the present disclosure. Referring to FIG. 2, pixel cell manufacturing process 200 includes providing a layer of semiconductor material (step 210); forming a photodiode, a floating diffusion, and a plurality of doped regions of a plurality of pixel transistors of the pixel in the layer of semiconductor material (step 220); followed by forming a gate oxide layer over the layer of semiconductor material (step 230). In some examples, the gate oxide layer can include silicon dioxide ($SiO_2$), which can be made using wet-oxidation or using in situ steam generation (ISSG) oxidation process of a semiconductor material (e.g., silicon). In some embodiment, the layer of semiconductor material may be formed on a bulk semiconductor substrate, for example by epitaxial growth process. In some embodiments, depending on processing technology and performance requirement of transistor, such as random telegraph signal (RTS) noise requirement, the thickness of the gate oxide layer may vary from 30 Å to 75 Å.

Figure 3A:
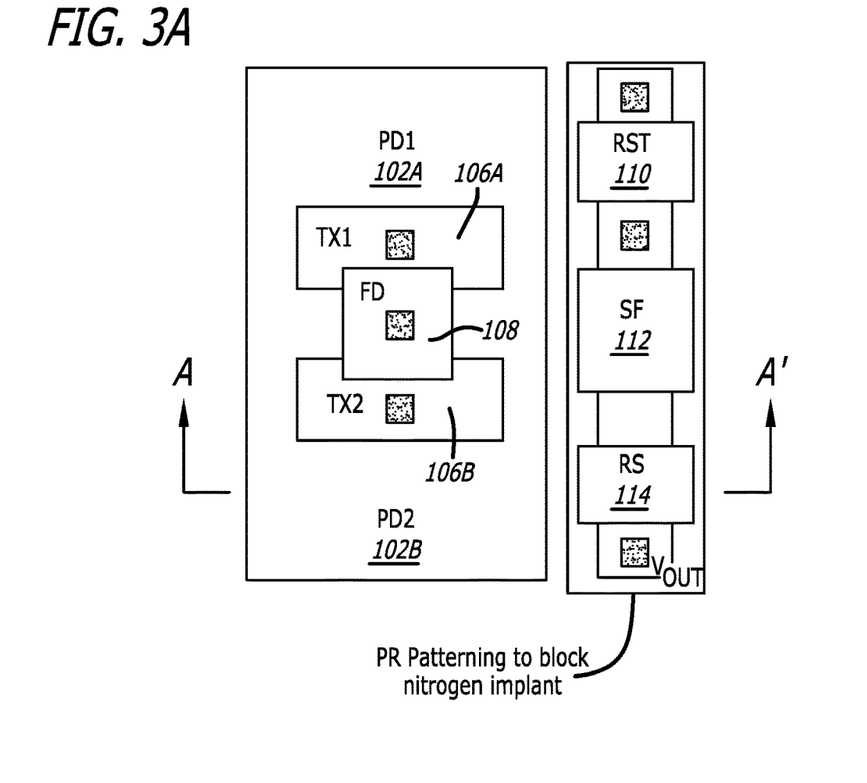
FIG. 3A is a plan view illustrating one example of a portion of pixel cell during an exemplary process step in accordance with the teachings of the present disclosure.

A plurality of gate electrodes of the plurality of pixel transistors of the pixel are then formed over the gate oxide layer (step 240). A photoresist patterned to selectively mask channel regions of the plurality of pixel transistors of the pixel, leaving a region above the photodiode exposed, is formed on the layer of semiconductor material, for example on a top surface of the layer of semiconductor material (step 250). FIG. 3A is a plan view illustrating one example of a portion of pixel cell after photoresist patterning in accordance with the teachings of the present disclosure. As shown in FIG. 3A, the pixel has a photoresist applied across a channel region that includes, for example, a reset transistor, a source follower transistor, and a row select transistor.

Figure 3B:
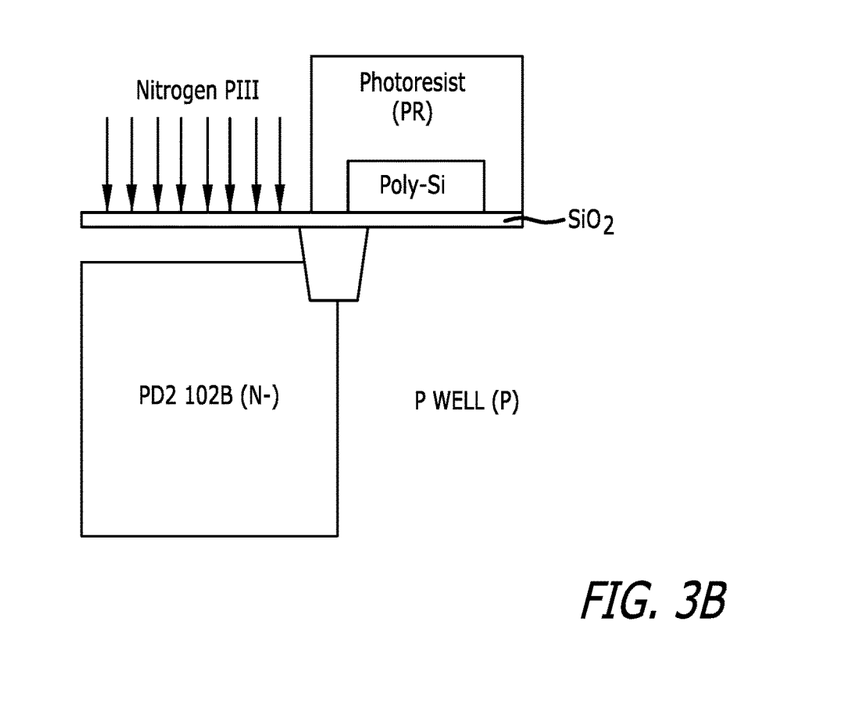
FIG. 3B is a cross-section view illustrating one example of a portion of a pixel cell during an exemplary process step in accordance with the teachings of the present disclosure.

Referring again to FIG. 2, after the photoresist has been applied, and nitrogen is implanted at a semiconductor material-gate oxide proximate interface at a region above the photodiode (step 270) forming a shallow nitrogen region between gate oxide layer and the semiconductor material. FIG. 3B is a cross-section view illustrating one example of a portion of a pixel cell in accordance with the teachings of the present disclosure. As shown in FIG. 3B, the implantation of nitrogen occurs at an exposed region of the semiconductor material-gate oxide proximate interface, but is blocked at a channel region including a pixel transistor that is masked by a photoresist.

Referring again to FIG. 2, after nitrogen implantation, the photoresist is removed to provide the channel regions of the plurality of pixel transistors of the pixel that are devoid of implanted nitrogen (step 280). In some embodiments, the photoresist is removed from the layer of the semiconductor material, for example by a strip and clean process, such as SC1 strip and clean process or sulfuric acid and hydrogen peroxide mixture (SPM) photoresist strip and clean process (step 290).

In some embodiments, the photoresist is made of a material that is substantially impermeable (e.g., 95% or more impermeable, 97% or more impermeable, 99% or more impermeable, or 100% impermeable) to nitrogen implantation. For example, the photoresist can include an epoxy-based polymer, or a mixture of diazonaphthoquinone and novolac resin).

In some embodiments, implanting nitrogen at the semiconductor material-gate oxide proximate interface at the region above the photodiode includes subjecting the semiconductor material-gate oxide proximate interface to plasma-immersion ion implantation (PIII).

The nitrogen implantation can occur on a very shallow silicon surface of the semiconductor material in the unmasked region of the semiconductor material-gate oxide proximate interface. In one embodiment, the nitrogen implantation is conducted on the very shallow silicon surface of the semiconductor material within the unmasked region or the exposed region of the gate oxide layer above the individual photodiodes. The nitrogen implantation quenches Si dangling bonds by forming Si—N bonds, and/or replaces Si—H bonds with Si—N bonds at the semiconductor material-gate oxide proximate interface (e.g., by forming $SiO_xN_y$).

Figure 3C:
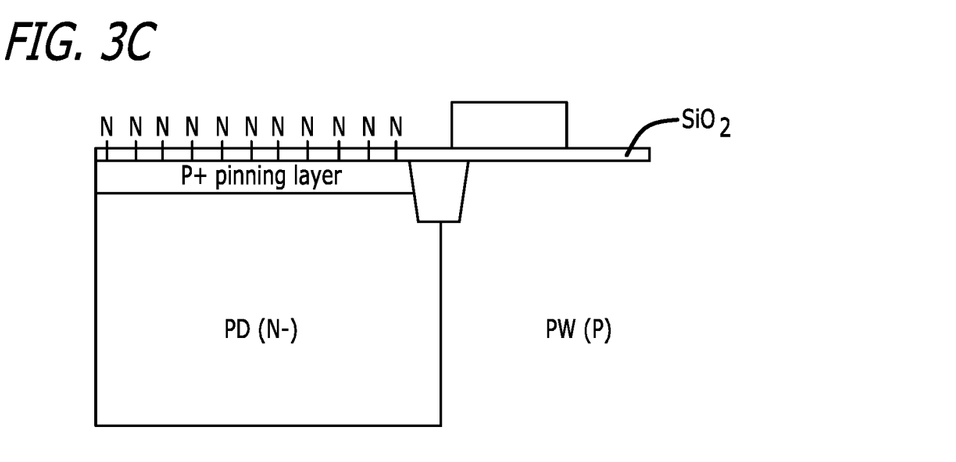
FIG. 3C is a cross-section view illustrating one example of a portion of a pixel cell during an exemplary process step in accordance with the teachings of the present disclosure.

Referring again to FIG. 2, the process can further include implanting a pinning layer over the photodiode (step 260). In some embodiments, the pinning layer over the photodiode can be implanted after implanting the nitrogen at the semiconductor material-gate oxide proximate interface at the region above of the photodiode. In some embodiments, the pinning layer over the photodiode can be implanted before said implanting the nitrogen at the semiconductor material-gate oxide proximate interface at the region above of the photodiode. FIG. 3C is a cross-section view illustrating one example of a portion of a pixel cell in accordance with the teachings of the present disclosure. As shown in FIG. 3C, the pixel cell includes a nitrogen implanted semiconductor material-gate oxide proximate interface disposed over a pinning layer, which is in turn disposed over the photodiode. The channel regions of the pixel transistor in the pixel cell are devoid of implanted nitrogen at the semiconductor material-gate oxide proximate interface.

Figure 3D:
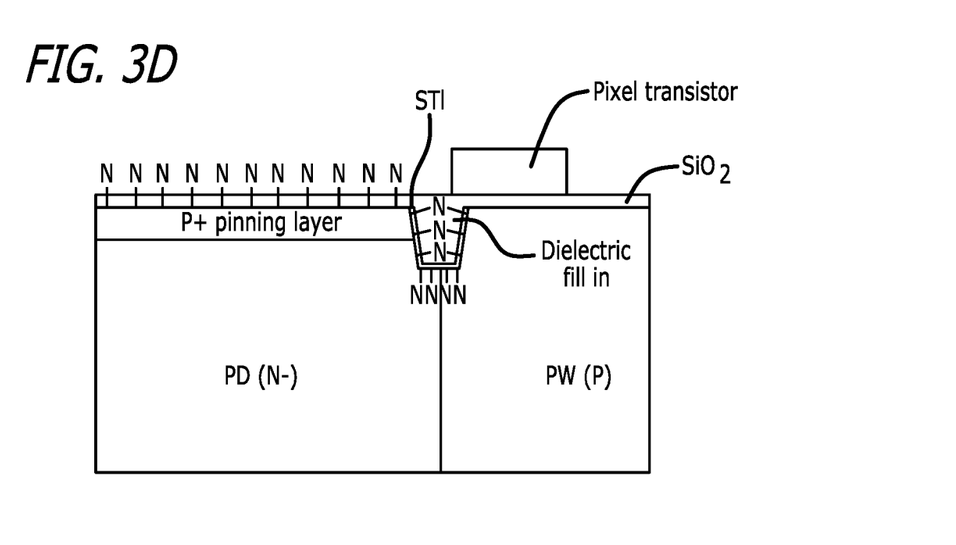
FIG. 3D is a cross-section view illustrating one example of a portion of a pixel cell in accordance with the teachings of the present disclosure.

In some embodiments, nitrogen may also implanted onto the sidewalls and bottom of a shallow trench isolation (STI) structure disposed between photodiodes PD and region of pixel transistors providing isolation between photodiode PD and pixel transistors (e.g., reset transistor, source follower transistor, and the like), to further reduce dangling bonds at trench sidewall and bottom surfaces that could result in traps sites, thus further reducing dark current noise. For example, during formation of the STI structure, after oxidation of sidewalls and bottom of the STI structure forming a liner oxide layer on sidewalls and bottom of the STI structure and prior to dielectric back fill (e.g., oxide fill) into trench structure of STI structure, a shallow implant of nitrogen can be implanted underneath the liner oxide layer by plasma implantation at various tilt angle (for example implant at an angle 5-45 degree), to have the shallow implant of nitrogen fully cover sidewall surfaces and bottom surface of the STI structure. FIG. 3D is a cross-section view illustrating one example of a portion of a pixel cell in accordance with the teachings of the present disclosure. FIG. 3D illustrates an exemplary pixel cell structure having a nitrogen-implanted semiconductor material-gate oxide proximate interface disposed over a pinning layer and sidewall surfaces/bottom surface of a STI structure between a photodiode and region of pixel transistor (e.g., source follower transistor, reset transistor, row select transistor). In embodiments, at least a portion of a gate of a pixel transistor may be formed above the STI structure. Restated, the shallow trench structure disposed adjacent to the photodiode having sidewall surface and a bottom surface is implanted with nitrogen. The channel regions of the pixel transistor in the pixel cell are devoid of implanted nitrogen at the semiconductor material-gate oxide proximate interface.

Examples of the pixel cell of the present disclosure offer numerous advantages. For example, the pixel cell can be made using existing methods. The pixel cell can have reduced white pixel, and reduced random telegraph signal noise compared to a pixel cell that has not been subjected to nitrogen implantation at the semiconductor material-gate oxide proximate interface at the region above the photodiode; and/or compared to a pixel cell that has nitrogen implantation both at the semiconductor material-gate oxide proximate interface at the region above the photodiode and above the transistor channel regions. For example, the pixel can have a white pixel reduction of from 140 ppm to 60 ppm compared to a pixel that has not been subjected to nitrogen implantation at the semiconductor material-gate oxide proximate interface at the region above the photodiode. The pixel can have a white pixel reduction by 50% or more compared to a pixel that has not been subjected to nitrogen implantation at the semiconductor material-gate oxide proximate interface at the region above the photodiode. In some embodiments, the pixel has a dark current reduction of from 2.4 electrons/s to 2.0 electrons/s compared to a pixel that has not been subjected to nitrogen implantation at the semiconductor material-gate oxide proximate interface at the region above the photodiode. In some embodiments, the pixel has a dark current reduction by about 20% compared to a pixel that has not been subjected to nitrogen implantation at the semiconductor material-gate oxide proximate interface at the region above the photodiode. In certain embodiments, the pixel has an RTS (random telegraph signal) noise decrease from about 150 ppm to about 70 ppm compared to a pixel that has implanted nitrogen in the channel regions of the plurality of pixel transistors (e.g., both at the semiconductor material-gate oxide proximate interface at the region above the photodiode and above the transistor channel regions).

Figure 4:
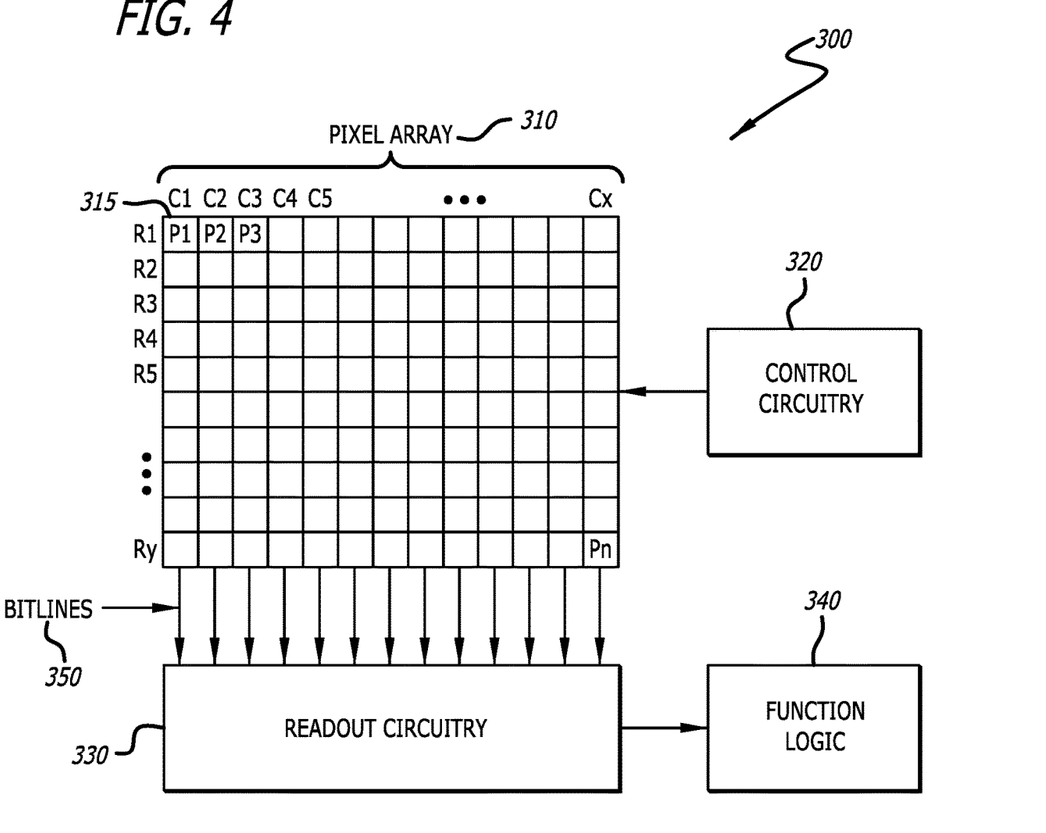
FIG. 4 is a schematic illustrating one example of an imaging system including a pixel array having pixel cells in accordance with the teachings of the present disclosure.

FIG. 4 is a block diagram illustrating one example of imaging system 300. Imaging system 300 includes a pixel array 310, control circuitry 320, readout circuitry 330, and function logic 340. In one example, pixel array 310 is a two-dimensional (2D) array of photodiodes, or image sensor pixels 315 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and can take other configurations.

In one example, after the image sensor photodiode/pixel 315 in pixel array 310 has acquired its image data or image charge, the image data is readout by readout circuitry 330 through bitlines 350 and then transferred to function logic 340. In various examples, readout circuitry 330 can include amplification circuitry, analog-to-digital (ADC) conversion circuitry, or otherwise. Function logic 340 can simply store the image data or even manipulate the image data by applying post image effects (e.g., crop, rotate, remove red eye, adjust brightness, adjust contrast, or otherwise). In one example, readout circuitry 330 can read out a row of image data at a time along readout column lines (illustrated) or can readout the image data using a variety of other techniques (not illustrated), such as a serial readout or a full parallel readout of all pixels simultaneously.

In one example, control circuitry 320 is coupled to pixel array 310 to control operation of the plurality of photodiodes in pixel array 310. For example, control circuitry 320 can generate a shutter signal for controlling image acquisition. In one example, the shutter signal is a global shutter signal for simultaneously enabling all pixels within pixel array 310 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects, such as a flash.

Referring the example depicted in FIG. 4, an imaging system 300 can include a pixel array 310 including a plurality of pixel cells 315 as described in the present disclosure, a control circuitry 320 coupled to the pixel array 310 to control operation of the pixel cells 315; and a readout circuitry 330 coupled to the pixel array 310 to read out image data from the pixel cells 315. The imaging system can further include function logic 340 coupled to the readout circuitry to store image data from the pixel array.

In one example, each one of the pixel cells 315 of the pixel array 310 in the imaging system 300 can include a photodiode, a floating diffusion, a plurality of doped regions of a plurality of pixel transistors of the pixel disposed in a layer of semiconductor material, a gate oxide layer disposed over the layer of semiconductor material, and a plurality of gate electrodes of the plurality of pixel transistors of the pixel disposed over the gate oxide layer, for example, as described above. A nitrogen-implanted region is present at a semiconductor material-gate oxide proximate interface at a region above the photodiode, and the semiconductor material-gate oxide proximate interface is devoid of implanted nitrogen in channel regions of the plurality of pixel transistors. In some embodiments, the nitrogen-implanted region at the semiconductor material-gate oxide proximate interface at the region above the photodiode includes Si—N bonds. For example, the nitrogen-implanted region at the semiconductor material-gate oxide proximate interface at the region above the photodiode can includes fewer Si dangling bonds and Si—H bonds compared to a semiconductor material-gate oxide proximate interface that has not been implanted with nitrogen.

In one example, each pixel cell 315 of the pixel array 310 in the imaging system 300 can further include a transfer gate disposed over the semiconductor material between the photodiode and the floating diffusion. The transfer gate is coupled to selectively transfer the image charge from the photodiode to the floating diffusion.

In some embodiments, in a given pixel cell 315, the photodiode is a first photodiode of a plurality of photodiodes adapted to photogenerate image charge in response to incident light, and the transfer gate is a first transfer gate of a plurality of transfer gates. The pixel cell 315 can further include a second photodiode in the plurality of photodiodes, and a second transfer gate in the plurality of transfer gates, as described, for example in FIG. 1 and above.

As discussed above, in some embodiments, the plurality of pixel transistors includes a reset transistor, a source follower transistor, and a row select transistor. In some embodiments, the plurality of pixel transistors includes a transfer transistor, a reset transistor, a source follower transistor, and a row select transistor. In some embodiments, the channel regions of the plurality of pixel transistors include the regions over the transfer resistor(s), floating diffusion, reset transistor, source follower transistor, and a row select transistor.

As discussed above, the nitrogen-implanted region at the semiconductor material-gate oxide proximate interface at the region above the photodiode comprises Si—N bonds. For example, the nitrogen-implanted region at the semiconductor material-gate oxide proximate interface at the region above the photodiode can have fewer Si dangling bonds and Si—H bonds compared to a semiconductor material-gate oxide proximate interface that has not been implanted with nitrogen.

Each one of the pixel cells can have reduced white pixel, and reduced random telegraph signal noise compared to a pixel cell that has not been subjected to nitrogen implantation at the semiconductor material-gate oxide proximate interface at the region above the photodiode; and/or compared to a pixel cell that has nitrogen implantation both at the semiconductor material-gate oxide proximate interface at the region above the photodiode and above the transistor channel regions. For example, each one of the pixel cells can have a white pixel reduction of from 140 ppm to 60 ppm compared to a pixel that has not been subjected to nitrogen implantation at the semiconductor material-gate oxide proximate interface at the region above the photodiode. Each one of the pixel cells can have a white pixel reduction of by 50% or more compared to a pixel that has not been subjected to nitrogen implantation at the semiconductor material-gate oxide proximate interface at the region above the photodiode. Each one of the pixel cells can have a dark current reduction of from 2.4 electrons/s to 2.0 electrons/s compared to a pixel that has not been subjected to nitrogen implantation at the semiconductor material-gate oxide proximate interface at the region above the photodiode. Each one of the pixel cells can have a dark current reduction of by about 20% compared to a pixel that has not been subjected to nitrogen implantation at the semiconductor material-gate oxide proximate interface at the region above the photodiode. In certain embodiments, each one of the pixel cells has an RTS (random telegraph signal) noise decrease of from about 150 ppm to about 70 ppm compared to a pixel that has implanted nitrogen in the channel regions of the plurality of pixel transistors (e.g., both at the semiconductor material-gate oxide proximate interface at the region above the photodiode and above the transistor channel regions).

In one example, imaging system 300 can be included in a digital camera, cell phone, laptop computer, automobile or the like. Additionally, imaging system 300 can be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware can deliver instructions to imaging system 300, extract image data from imaging system 300, or manipulate image data supplied by imaging system 300.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
   a photodiode, a floating diffusion, and a plurality of doped regions of a plurality of pixel transistors of the pixel disposed in a layer of semiconductor material;
   a gate oxide layer disposed over the layer of semiconductor material, the gate oxide layer comprising a nitrogen-implanted region at a semiconductor material-gate oxide proximate interface at a region above the photodiode;
   a pinning layer disposed at least partially under the gate oxide layer;
   a plurality of gate electrodes of the plurality of pixel transistors of the pixel disposed over the gate oxide layer; and
   a shallow trench isolation (STI) structure disposed adjacent to the photodiode, the shallow trench isolation structure having sidewall surfaces and a bottom surface that are at least partially disposed underneath the gate oxide layer, wherein the sidewall surfaces and the bottom surface are implanted with nitrogen, wherein the shallow trench isolation extends to a depth that is below the pinning layer, and wherein the shallow trench isolation separates the gate electrodes from the photodiodes, wherein the semiconductor material-gate oxide proximate interface is devoid of implanted nitrogen in channel regions of the plurality of pixel transistors.

2. The pixel cell of claim 1, wherein the nitrogen-implanted region at the semiconductor material-gate oxide proximate interface at the region above the photodiode comprises Si—N bonds.

3. The pixel cell of claim 1, wherein the nitrogen-implanted region at the semiconductor material-gate oxide proximate interface at the region above the photodiode comprises fewer Si dangling bonds and Si—H bonds compared to a semiconductor material-gate oxide proximate interface that has not been implanted with nitrogen.

4. The pixel cell of claim 1, wherein the gate oxide layer has a thickness of 30 Å to 75 Å.

5. The pixel cell of claim 1, wherein the pixel comprises a white pixel reduction of from 140 ppm to 60 ppm compared to a pixel that has not been subjected to nitrogen implantation at the semiconductor material-gate oxide proximate interface at the region above the photodiode.

6. The pixel cell of claim 1, wherein the pixel comprises a white pixel reduction by at least 50% compared to a pixel that has not been subjected to nitrogen implantation at the semiconductor material-gate oxide proximate interface at the region above the photodiode.

7. The pixel cell of claim 1, wherein the pixel comprises a dark current reduction of from 2.4 electrons/s to 2.0 electrons/s compared to a pixel that has not been subjected to nitrogen implantation at the semiconductor material-gate oxide proximate interface at the region above the photodiode.

8. The pixel cell of claim 1, wherein the pixel comprises a dark current reduction by at least 20% compared to a pixel that has not been subjected to nitrogen implantation at the semiconductor material-gate oxide proximate interface at the region above the photodiode.

9. The pixel cell of claim 1, wherein the pixel comprises an RTS (random telegraph signal) noise decrease of from 150 ppm to 70 ppm compared to a pixel comprising nitrogen in the channel regions of the plurality of pixel transistors.

10. The pixel cell of claim 1, wherein the plurality of pixel transistors comprises a reset transistor, a source follower transistor, and a row select transistor.

11. An imaging system, comprising:
an array of pixel cells, wherein each one of the pixel cells comprises:
a photodiode, a floating diffusion, a plurality of doped regions of a plurality of pixel transistors disposed in a layer of semiconductor material;
a gate oxide layer disposed over the layer of semiconductor material;
a pinning layer disposed at least partially under the gate oxide layer;
a plurality of gate electrodes of the plurality of pixel transistors of the pixel disposed over the gate oxide layer;
wherein the pixel cell comprises a nitrogen-implanted region at a semiconductor material-gate oxide proximate interface at a region above the photodiode, and
wherein the pixel cell is devoid of implanted nitrogen in channel regions of the plurality of pixel transistors; and
a shallow trench isolation (STI) structure disposed adjacent to the photodiode, the shallow trench isolation structure having sidewall surfaces and a bottom surface that are at least partially disposed underneath the gate oxide layer, wherein the sidewall surfaces and the bottom surface are implanted with nitrogen, wherein the shallow trench isolation extends to a depth that is below the pinning layer, and wherein the shallow trench isolation separates the gate electrodes from the photodiodes;
a control circuitry coupled to the array of pixel cells to control operation of the array of pixel cells; and
a readout circuitry coupled to the array of pixel cells to read out image data from the array of pixel cells.

12. The imaging system of claim 11, further comprising a function logic coupled to the readout circuitry to store image data from the pixel array.

13. The imaging system of claim 11, wherein the plurality of pixel transistors comprises a reset transistor, a source follower transistor, and a row select transistor.

14. The imaging system of claim 11, wherein the nitrogen-implanted region at the semiconductor material-gate oxide proximate interface at the region above the photodiode comprises Si—N bonds.

15. The imaging system of claim 11, wherein the nitrogen-implanted region at the semiconductor material-gate oxide proximate interface at the region above the photodiode comprises fewer Si dangling bonds and Si—H bonds compared to a semiconductor material-gate oxide proximate interface that has not been implanted with nitrogen.

16. The imaging system of claim 11, wherein the gate oxide layer has a thickness of 30 Å to 75 Å.

17. The imaging system of claim 11, wherein each one of the pixel cells comprises a white pixel reduction of from 140 ppm to 60 ppm compared to a pixel that has not been subjected to nitrogen implantation at the semiconductor material-gate oxide proximate interface at the region above the photodiode.

18. The imaging system of claim 11, wherein each one of the pixel cells comprises a white pixel reduction by at least 50% compared to a pixel that has not been subjected to nitrogen implantation at the semiconductor material-gate oxide proximate interface at the region above the photodiode.

19. The imaging system of claim 11, wherein each one of the pixel cells comprises a dark current reduction of from 2.4 electrons/s to 2.0 electrons/s compared to a pixel that has not been subjected to nitrogen implantation at the semiconductor material-gate oxide proximate interface at the region above the photodiode.

20. The imaging system of claim 11, wherein each one of the pixel cells comprises a dark current reduction by at least 20% compared to a pixel that has not been subjected to nitrogen implantation at the semiconductor material-gate oxide proximate interface at the region above the photodiode.

21. The imaging system of claim 11, wherein each one of the pixel cells comprises an RTS (random telegraph signal) noise decrease of from 150 ppm to 70 ppm compared to a pixel comprising nitrogen in the channel regions of the plurality of pixel transistors.

* * * * *